(12) United States Patent
Komine et al.

(10) Patent No.: US 6,291,377 B1
(45) Date of Patent: *Sep. 18, 2001

(54) SILICA GLASS AND ITS MANUFACTURING METHOD

(75) Inventors: Norio Komine; Seishi Fujiwara, both of Sagamihara; Hiroki Jinbo, Yokohama, all of (JP)

(73) Assignee: Nikon Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/150,613

(22) Filed: Sep. 10, 1998

Related U.S. Application Data

(63) Continuation-in-part of application No. 08/915,562, filed on Aug. 21, 1997, now Pat. No. 5,958,809.

(30) Foreign Application Priority Data

Sep. 11, 1997 (JP) .................................................. 9-246841

(51) Int. Cl.$^7$ .................................................... C03C 3/06
(52) U.S. Cl. ............................................................ 501/54
(58) Field of Search ................................ 501/54; 359/355

(56) References Cited

U.S. PATENT DOCUMENTS

| | | | | |
|---|---|---|---|---|
| 5,330,941 | * | 7/1994 | Yaba et al. | 501/54 |
| 5,335,306 | * | 8/1994 | Takita et al. | 501/54 |
| 5,364,433 | * | 11/1994 | Nishimura et al. | 501/54 |
| 5,523,266 | * | 6/1996 | Nishimura et al. | 501/54 |
| 5,696,624 | * | 12/1997 | Komine et al. | 359/355 |
| 5,958,809 | * | 9/1999 | Fujiwara et al. | 501/54 |
| 6,087,283 | * | 7/2000 | Jinbo et al. | 501/54 |

FOREIGN PATENT DOCUMENTS

| | | |
|---|---|---|
| 0488320 A1 | 6/1992 | (EP) . |
| 0 835 848 A2 | 4/1998 | (EP) . |
| 0 835848 A2 | 4/1998 | (EP) . |
| 0 835848 A3 | 6/1998 | (EP) . |
| 07 187683 | 7/1995 | (JP) . |
| 07 291635 | 11/1995 | (JP) . |

* cited by examiner

*Primary Examiner*—Karl Group
(74) *Attorney, Agent, or Firm*—Morgan, Lewis & Bockius LLP

(57) ABSTRACT

A method is provided for manufacturing a silica glass that is substantially free of chlorine. The method includes the step of separately expelling a silicon tetrafluoride gas, a combustion gas, and a combustible gas from a burner made of silica glass, the flow velocity of the silicon tetrafluoride gas being within the range of about 9 slm/cm$^2$ to about 20 slm/cm$^2$. The method further includes the steps of producing minute silica glass particles by reacting the silicon tetrafluoride gas with water produced by a reaction of the combustion gas with the combustible gas, depositing the minute silica glass particles on a target, and producing the silica glass by fusing and vitrifying the minute silica glass particles deposited on the target.

18 Claims, 2 Drawing Sheets

SILICA GLASS AND ITS MANUFACTURING METHOD

This application is a continuation-in-part of U.S. application Ser. No. 08/915,562, filed Aug. 21, 1997, now U.S. Pat. No. 5,958,809.

This application claims the benefit of Japanese Application No. 09-246841, filed in Japan on Sep. 11, 1997, which is hereby incorporated by reference.

BACKGROUND OF THE INVENTION

1. Field of the Invention

The present invention relates to silica glass that is substantially free of chlorine (Cl) and has a superior durability against ultraviolet (UV) light, and its method of manufacture.

2. Discussion of the Related Art

Conventionally, reduction projection exposure apparatus called a stepper is often used for exposing and transcribing integrated circuit patterns onto a wafer, such as a silicon wafer, using photolithographic technology.

The optical system of this stepper (reduction projection exposure apparatus) is mainly constructed of an illumination optical system and a projection optical system. The illumination optical system is used, to radiate the light source beam uniformly onto a reticle where an integrated circuit pattern is drawn. The projection optical system is used to reduce the image of the integrated circuit pattern, and project and transfer the reduced image onto the wafer.

Due to recent trends towards greater integration of LSI, it has become necessary for the pattern transcribed on the wafer to have a higher resolution. Therefore, as the light source of the stepper, shorter wavelengths, from the g-line (436 nm) and the i-line (365 nm) to excimer lasers, such as KrF (248 nm) and ArF (193 nm), are increasingly being used.

Conventional optical glass used as the lens for these illumination optical systems and projection optical systems has a problem of its low light transmittance in the short wavelength range below the i-line. Currently, synthesized silica glass is used as the lens material instead of conventional optical glass.

This silica glass can be manufactured (synthesized) for example, by vapor-phase synthesis called the "direct method". This direct method include the following steps, for example.

(1) The step for expelling a gaseous silicon compound as a material, an oxygen gas, and a hydrogen gas from a burner made of silica glass. In general, the gaseous silicon compound is diluted with a carrier gas (an oxygen gas, for example) upon emission.

(2) The step for generating minute silica glass particles (soot) by reacting the gaseous silicon compound and water which is a reaction product of the oxygen and hydrogen gases.

(3) The step for depositing the minute silica glass particles on a target.

(4) The step for creating silica glass (lump) by fusing and vitrifying the minute silica glass particles deposited on the target.

It has been discovered that the silica glass manufactured with this manufacturing method using silicon tetrafluoride gas as a gaseous silicon compound is substantially free of chlorine in the silica glass and exhibits a high durability against ultraviolet light, as compared with silica glass manufactured using silicon tetrachloride as the material.

However, when silica glass is synthesized using the silicon tetrafluoride ($SiF_4$) gas as the material, a new problem emerges as a trade-off for the high durability to ultraviolet light. The problem is that the uniformity in refractive index tends to deteriorate in the resultant silica glass.

SUMMARY OF THE INVENTION

Accordingly, the present invention is directed to a silica glass and its manufacturing method that substantially obviate the problems due to limitations and disadvantages of the related art.

An object of the present invention is to provide a silica glass having a superior ultraviolet light durability and a uniform refractive index profile.

Another object of the present invention is to provide a method for manufacturing a silica glass having a superior ultraviolet light durability and a uniform refractive index profile.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention provides a silica glass that is substantially free of chlorine (Cl), including a fluorine (F) concentration of about 100 ppm to about 450 ppm, a difference between the maximum refractive index and the minimum refractive index of the silica glass ($\Delta n$) being within the range of about $1.0 \times 10^{-7}$ to about $1.0 \times 10^{-5}$.

In another aspect, the present invention provides a silica glass having a chlorine concentration of about 0.1 ppm or less and a fluorine concentration of about 100 ppm to about 450 ppm, the silica glass having a substantially uniform refractive index distribution with respect to ultraviolet light such that a difference between the maximum refractive index and the minimum refractive index is within the range of about $1.0 \times 10^{-7}$ to about $1.0 \times 10^{-5}$.

In another aspect, the present invention provides a method for manufacturing a silica glass that is substantially free of chlorine, the method including the steps of separately expelling a silicon tetrafluoride gas, a combustion gas, and a combustible gas from a burner made of silica glass, the flow velocity of the silicon tetrafluoride gas being within the range of about 9 $slm/cm^2$ to about 20 $slm/cm^2$; producing minute silica glass particles by reacting the silicon tetrafluoride gas with water produced by a reaction of the combustion gas with the combustible gas; depositing the minute silica glass particles on a target; and producing the silica glass by fusing and vitrifying the minute silica glass particles deposited on the target.

In a further aspect, the present invention provides a method for manufacturing a silica glass, the method including the steps of expelling a combustion gas, a combustible gas, and a material gas including a silicon tetrafluoride gas separately from a burner, the flow velocity of the silicon tetrafluoride gas included in the material gas being within the range of about 9 $slm/cm^2$ to about 20 $slm/cm^2$; reacting the combustible gas with the combustion gas to produce water; reacting the silicon tetrafluoride gas with the water to produce and deposit minute silica particles on a target; and fusing and vitrifying the minute silica particles deposited on the target to produce the silica glass.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute apart of this specification, illustrate embodiments of the invention and together with the description serve to explain the principles of the invention.

In the drawings.

DETAILED DESCRIPTION OF THE PREFERRED EMBODIMENTS

Figure 1:
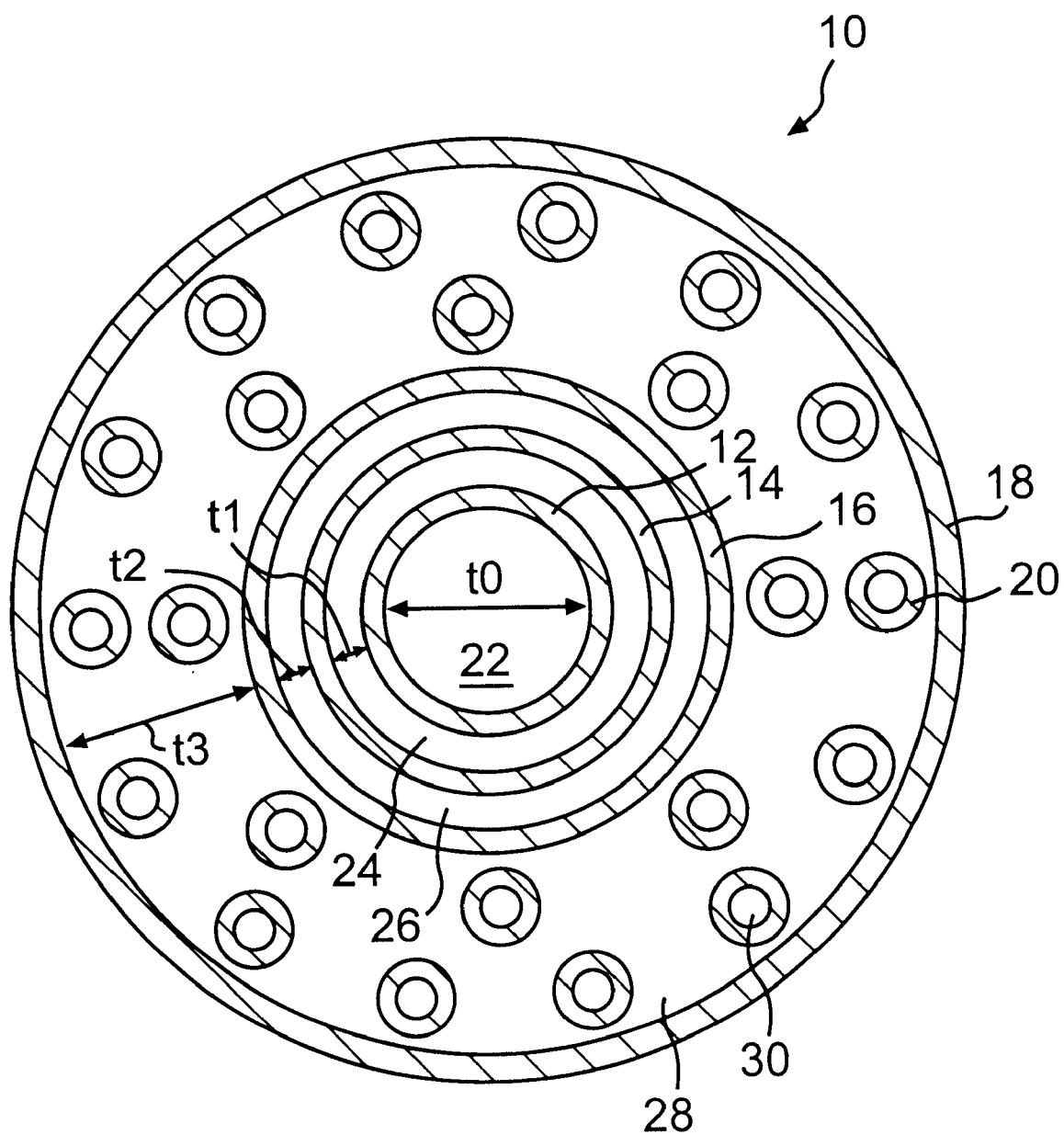
FIG. 1 shows a cross-section of the nozzles of a gas burner made of silica glass according to the present invention.

Some of the causes of the above-mentioned problems are inappropriate manufacturing conditions during the synthesis of the silica glass using the direct method. Examples of such include an inconsistent temperature distribution on the synthesis surface (target surface) formed by flame, fluctuations in flame hydrolysis reaction or thermolysis/thermal oxidation reaction, and nonuniform diffusion of impurities in the silica glass (such as the OH group or chlorine). These variations (fluctuations) in the manufacturing conditions have significant influences on striations that may be grown in the silica glass (called "striae") and the refractive index profile in the radial direction in the silica glass. These fluctuations cause non-uniformity in the refractive index of the silica glass. In addition, it has been found that the poor uniformity in the refractive index of the silica glass manifests itself especially when the silicon tetrafluoride gas is used as the material for the silica glass synthesis.

As a result of diligent studies, the inventors of the present invention have identified the cause of lowering the uniformity in the refractive index of the synthesized silica glass in the case of using the silicon tetrafluoride gas. The cause is that these manufacturing conditions fluctuate during the silica glass synthesis, and accordingly, the non-reacted silicon tetrafluoride that could not be hydrolyzed is included in the silica glass. Therefore, the density (distribution) of fluorine in the silica glass may excessively increase and/or a non-uniform fluorine density distribution may be created.

Thus, the present inventors have discovered that in order to obtain uniformity in the refractive index of the silica glass when silica glass is synthesized using silicon tetrafluoride, it is important to achieve a uniform fluorine density distribution by controlling the fluorine density within a certain range, Accordingly, the present invention provides a silica glass that is substantially free of chlorine (Cl) in which the density of fluorine (F) is controlled within the range of about 100 ppm to about 450 ppm, and in which the difference between the maximum refractive index and the minimum refractive index ($\Delta n$) is controlled within the range of about $1.0 \times 10^{-7}$ to about $1.0 \times 10^{-5}$.

Furthermore, in order to have a better uniformity in the refractive index of the silica glass, it is preferable to set the value of the fluorine density in the silica glass to be within the range of about 120 ppm to about 300 ppm, and more preferably, the value should be within the range of about 140 ppm to about 200 ppm.

In addition, in the present invention, it is preferable to set the value of the hydroxy group (OH group) density in the silica glass to be within the range of about 600 ppm to about 1300 ppm.

When the density of the hydroxy group in the silica glass is controlled within this range, it is possible to obtain a silica glass with a superior ultraviolet light durability. This is because structural defects such as oxygen deficiency is compensated by the hydroxy group (OH group) and thus a stable structure is created.

For even better ultraviolet light durability for the silica glass, it is preferable to have the hydroxy group density in the silica glass within the range from about 900 ppm to about 1200 ppm.

In the present invention, if the silica glass includes any one of metal impurities, such as Mg (magnesium), Ca (calcium), Sc (scandium), Ti (titanium), V (vanadium), Cr (chromium), Mn (manganese), Fe (iron), Co (cobalt), Ni, (nickel), Cu (copper), Zn (zinc) and Al (aluminum), it is preferable to set the density of such a metal element in the silica glass to be about 20 ppb or less.

It has been found that each of these metal elements reduces the durability against excimer laser irradiation of the silica glass. Therefore, by setting the density of each metal element to be about 20 ppb or less, it is possible to obtain a silica glass with a superior durability against excimer laser irradiation.

In another aspect, the present invention provides a method for manufacturing a silica glass that is substantially free of chlorine (Cl), including the steps of expelling a silicon tetrafluoride ($SiF_4$) gas, a combustion gas such as oxygen gas ($O_2$) and a combustible gas such as hydrogen gas ($H_2$) separately from a burner made of silica glass; providing minute silica glass particles by reacting the silicon tetrafluoride gas and water which is a reaction product of the combustion gas (oxygen gas) and the combustible gas (hydrogen gas); depositing the minute silica glass particles on a target; and producing the silica glass by fusing and vitrifying the minute silica glass particles deposited on the target, wherein the flow velocity of said silicon tetrafluoride gas is within the range of about 9 slm/cm$^2$ to about 20 slm/cm$^2$.

It was found that the flow velocity of the silicon tetrafluoride gas has an influence on, for example, the density of the fluorine included in the silica glass. Accordingly, by manufacturing the silica glass using the method described above, it is possible to control the fluorine density in the silica glass within the range of about 100 ppm to about 450 ppm and to control the difference ($\Delta n$) between the maximum refractive index and the minimum refractive index of the silica glass within the range of about $1.0 \times 10^{-7}$ to about $1.0 \times 10^{-5}$ with the silica glass being essentially chlorine free.

Furthermore, from the point of view of easily controlling the fluorine density, the chlorine density, and the difference ($\Delta n$) between the maximum refractive index and the minimum refractive index of the silica glass, it is more preferable to set the flow velocity of the silicon tetrafluoride gas to be within the range of about 9.2 to about 19.0 slm/cm$^2$.

In addition, for the operation of the manufacturing method of the silica glass of the present invention, it is preferable to control the flow velocity of the silicon tetrafluoride gas ($SiF_4$) using a mass flow controller. This is because by using a mass flow controller, it is possible to control the flow velocity of the silicon tetrafluoride gas more accurately, and accordingly, it is easy to control the fluorine density, the chlorine density, and the difference ($\Delta n$) between the maximum refractive index and the minimum refractive index of the silica glass.

A mass flow controller is a type of mass flow meter and is a flow meter that is capable of controlling the flow of gas material by monitoring the mass of the fluid that passes through the mass flow controller which in this case is the gaseous state of a gas material such as silicon tetrafluoride gas, or liquid state material obtained by lowering the temperature of the gas material.

For the operation of the manufacturing method of the silica glass of the present invention, it is preferable that minute silica glass particles (soot) are deposited on the target while the target is being lowered at a rate (lowering rate) within the range of about 0.5 mm/hr to about 2.35 mm/hr so that a predetermined distance is maintained between the upper surface of the ingot and the burner. This is preferable because by controlling the lowering speed of the target within the above range, it is possible to easily control the fluorine density, the chlorine density, and the difference ($\Delta n$) between the maximum refractive index and the minimum refractive index of the silica glass.

In the manufacturing method of the silica glass of the present invention, it is preferable that the fluorine (F) density in the silica glass be within the range of about 100 ppm to about 450 ppm and that the difference ($\Delta n$) between the maximum refractive index and the minimum refractive index of the silica glass be within the range of about $1.0 \times 10^{-7}$ to about $1.0 \times 10^{-5}$. This is because by controlling the fluorine density in the silica glass and the difference ($\Delta n$) between the maximum refractive index and the minimum refractive index of the silica glass in such a manner, it is possible to obtain a silica glass with a superior ultraviolet light durability and a uniform refractive index profile.

Furthermore, to obtain a silica glass with an even better ultraviolet light durability and uniform refractive index and also to further simplify the control of the manufacturing process and quality control of the material, it is more preferable that the difference ($\Delta n$) between the maximum refractive index and the minimum refractive index of the silica glass be within the range of about $5.0 \times 10^{-7}$ to about $6.0 \times 10^{-6}$.

In addition, for the operation of the manufacturing method of the silica glass of the present invention it is preferable that the ratio of the flow of the combustion gas, such as oxygen gas ($O_2$), to the flow of the combustible gas, such as hydrogen gas ($H_2$), (oxygen gas flow/hydrogen gas flow) be within the range of about 0.2 to about 0.5. This is because by controlling the ratio of the flow of the combustion gas to the flow of the combustible gas to be within this range, it is possible to easily control the density of the hydroxy group (OH group) in the silica gas within the range of about 600 ppm to about 1300 ppm.

Here, the flow of the combustion gas is the total flow of combustion gas (such as oxygen gas) and in the case that the gas is expelled from separate expelling tubes, it corresponds to the sum of the flows of all the combustion gases emitted from expelling tubes. Also, when the same combustion gas is used as a carrier gas for the silicon tetrafluoride gas, the flow of that combustion gas is included in the total flow of the combustion gas defined here.

Similarly, the flow of the combustible gas (such as hydrogen gas) is the total flow of combustible gases, and when the gases are expelled from separate expelling tubes, the "flow of the combustible gas" corresponds to the sum of the flows of all the combustible gases emitted from the expelling tubes.

Reference will now be made in detail to the preferred embodiments of the present invention, examples of which are illustrated in the accompanying drawings.

First Preferred Embodiment (Working Example)

Various silica glasses were manufactured (synthesized) using the manufacturing method of the present invention.

(1) Using a burner made of silica glass, a silicon tetrafluoride ($SiF_4$) gas, an oxygen ($O_2$) gas, and a hydrogen ($H_2$) gas were supplied by expelling each of the gases at respective predetermined flow rates.

The silicon tetrafluoride gas was diluted with a carrier gas (oxygen gas: flow rate 1.8 slm), and was expelled from the center tube of a burner made of silica glass that is controlled by a mass flow controller with a flow rate set at 1.50 slm (See Table 1). The silicon tetrafluoride gas used had a purity of 99.99% or more. Contamination of metal impurities was 10 ppb or less for Fe and 2 ppb or less for each of Ni and Cr.

The burner that was used is described with reference to FIG. 1. FIG. 1 shows a cross-section of the nozzle of the burner made of silica glass. A material tube 12 with an inner diameter of 4.5 mm (also referred to as a center tube or the first tube) is provided at the center of nozzle 10 of the silica glass burner for expelling material. In FIG. 1, the inner diameter of the material tube 12 is indicated by reference character t0.

In addition, at the periphery of the material tube 12, the second tube 14 is arranged in a concentric configuration. Oxygen gas was expelled at a rate of 22 slm from a gap 24 (1.0 mm) between the material tube 12 and the second tube 14. The gap between the material tube 12 and the second tube 14 is indicated by reference character t1 in FIG. 1.

At the periphery of the second tube 14, a third tube 16 is arranged in a concentric configuration. The gap 26 between the second tube 14 and the third tube 16 is 1.0 mm. In FIG. 1, the gap 26 between the second tube 14 and the third tube 16 is indicated by reference character t2, and t2 and t1 have the same values. From the gap 26 between the second tube 14 and the third tube 16, a hydrogen gas was expelled at a rate of 75 slm.

On the outside of the third tube 16, a fourth tube 18 is arranged at a 45 mm distance in a concentric configuration with respect to tubes 12 to 16. In the gap 28 (45 mm) between the third tube 16 and the fourth tube 18, twenty two (22) fifth tubes 20 each having a diameter of 6.0 mm are arranged at appropriate intervals. A hydrogen gas was expelled from gap 28 between third tube 16 and fourth tube 18 (the gap 28 is indicated with a reference character t3), and an oxygen gas was expelled from the fifth tubes 20.

As described above, the reason why the oxygen and hydrogen gases are expelled from separate nozzles (for example, for oxygen gas, from gap 24 between second tube 12 and third tube 14, and from the fifth tubes 20) is that the oxygen gas and hydrogen gas will then react with each other more uniformly.

The ratio of the oxygen gas flow to the hydrogen gas flow affects the density of fluorine (F) and the density of hydroxy groups (OH groups) in the resulted silica glass, and accordingly, in this first embodiment, the ratio of the oxygen gas flow to hydrogen gas flow (oxygen gas flow/hydrogen gas flow) was set to 0.4.

The speed at which the silicon tetrafluoride (SiF$_4$) gas was expelled from the center tube of the silica glass burner (also referred to as the flow velocity or material flow speed) has a dominant effect on the fluorine (F) density in the silica glass. The speed at which the silicon tetrafluoride (SiF$_4$) gas is expelled can be obtained by dividing the flow rate of the silicon tetrafluoride gas by the area of the tip of the material tube of the silica glass burner. Therefore, when the inner diameter of the material tube is constant, the speed at which the material is expelled from the tip of the burner is equal to the material flow speed of the silicon tetrafluoride in the tube. In the first embodiment, as shown in Table 1, the speed at which the silicon tetrafluoride (SiF$_4$) gas is expelled was accurately controlled using a mass flow controller to provide a constant flow velocity of 9.4 slm/cm$^2$.

(2) Next, minute silica glass particles (soot) were produced by reacting the silicon tetrafluoride (SiF$_4$) gas with water which was a reaction product of the oxygen gas and the hydrogen gas. That is, using a silica glass burner, the oxygen gas and the hydrogen gas were mixed and burned, and in the resultant combustion flame, minute silica glass particles made of SiO$_2$ and hydrogen fluoride (HP) were produced by the hydrolysis reaction indicated in formula (1) below.

$$SiF_4 + 2H_2O \rightarrow SiO_2 + 4HF \quad (1)$$

This hydrolysis reaction occurs until the minute silica glass particles reach the deposition surface (stacking surface) on the target. Most of the silicon tetrafluoride (SiF$_4$) gas is hydrolyzed and becomes the material for producing the minute silica glass particles. However, a portion of the silicon tetrafluoride gas that is not hydrolyzed is included in the minute silica glass particles. Therefore, the silicon tetrafluoride gas included in the minute silica glass particles without being hydrolyzed may increase the fluorine density and become one of the causes for the poor uniformity in the refractive index of the resultant silica glass.

(3) Next, minute silica glass particles (soot) were deposited on the target. While the minute silica glass particles (soot) were deposited on the target, the target was lowered at a constant speed so that the distance between the deposition surface (stacking surface) of the minute silica glass particles and the silica glass burner was kept to be nearly consistent. In this first embodiment, as shown in Table 1, the speed at which the target was lowered was set to 1.00 mm/hr. The distance between the deposition surface (stacking surface) and the burner made of silica glass is set to be approximately 300 mm.

In the first embodiment, in order to uniformly deposit minute silica glass particles on the target, the target was rotated at a rate of seven rotations per minute and was rocked at 90 second interval within a 80 mm movement range, for example.

(4) Finally, silica glass was created by heating, fusing, and vitrifying the minute silica glass particles (soot) deposited on the target. The heat used for fusing and vitrifying the minute silica glass particle comes from the combustion of the oxygen and hydrogen gases expelled from the silica glass burner.

Surrounding the target, fire-resistant materials made of alumina with a purity of 99% were arranged with an inner shape having the following dimensions: length 600 mm×width 800 mm×height 800 mm. In this and the following examples, silica glass was deposited on the target while the target was rotated, and the produced silica glasses each took the form of an ingot with a diameter between 180 mm to 240 mm.

As described above, during the manufacture of synthetic silica glass using the direct method, minute silica glass particles are produced by a flame hydrolysis reaction, reach the target, and are fused and vitrified to form a silica glass ingot.

The "silica glass" in the present invention includes ingots, silica glass material (partially finished product) cut out from the ingot, and silica glass parts (such as a lens) obtained by processing the silica glass material.

Evaluating Properties of the Manufactured Silica Glass (1) Measurement of the Refractive Index First, seven test pieces (having a diameter of 150 mm and a thickness of 50 mm; referred to as the test pieces for the refractive index measurement) were cut out from the center portion of the manufactured silica glass ingot in order to measure the difference ($\Delta n$) between the maximum refractive index and the minimum refractive index in the silica glass.

Next, for the purpose of removing the residual distortion (birefringence), the cut out test pieces for the refractive index measurement were annealed in a furnace that was maintained at atmospheric conditions at a temperature of 1000° C. for 10 hours. Subsequently, the temperature of each test piece for the refractive index measurement was lowered to 500° C. with a lowering speed of 10° C./hour and then was returned to room temperature by natural air-cooling.

The refractive indices of the test pieces for the refractive index measurement, which went through the thermal process above, were measured by a Fizeau interferometer using a He—Ne laser as a light source. The same measurements were conducted on all the seven test pieces and the difference in the refractive index ($\Delta n$) was calculated using the maximum value and the minimum value of the measured refractive indices. The results are shown in Table 1.

As understood from Table 1, the value of $\Delta n$, which indicates the uniformity in the refractive index of the silica glass ingot of the first embodiment is $4.3 \times 10^{-6}$. This value is within the desirable range of $\Delta n$ (about $5.0 \times 10^{-7}$ to about $6.0 \times 10^{-6}$) and therefore, the refractive index difference ($\Delta n$) that is acceptable for the optical parts of the optical system of excimer laser lithography apparatus (about $1.0 \times 10^{-7}$ to about $1.0 \times 10^{-5}$) was achieved.

Figure 2:
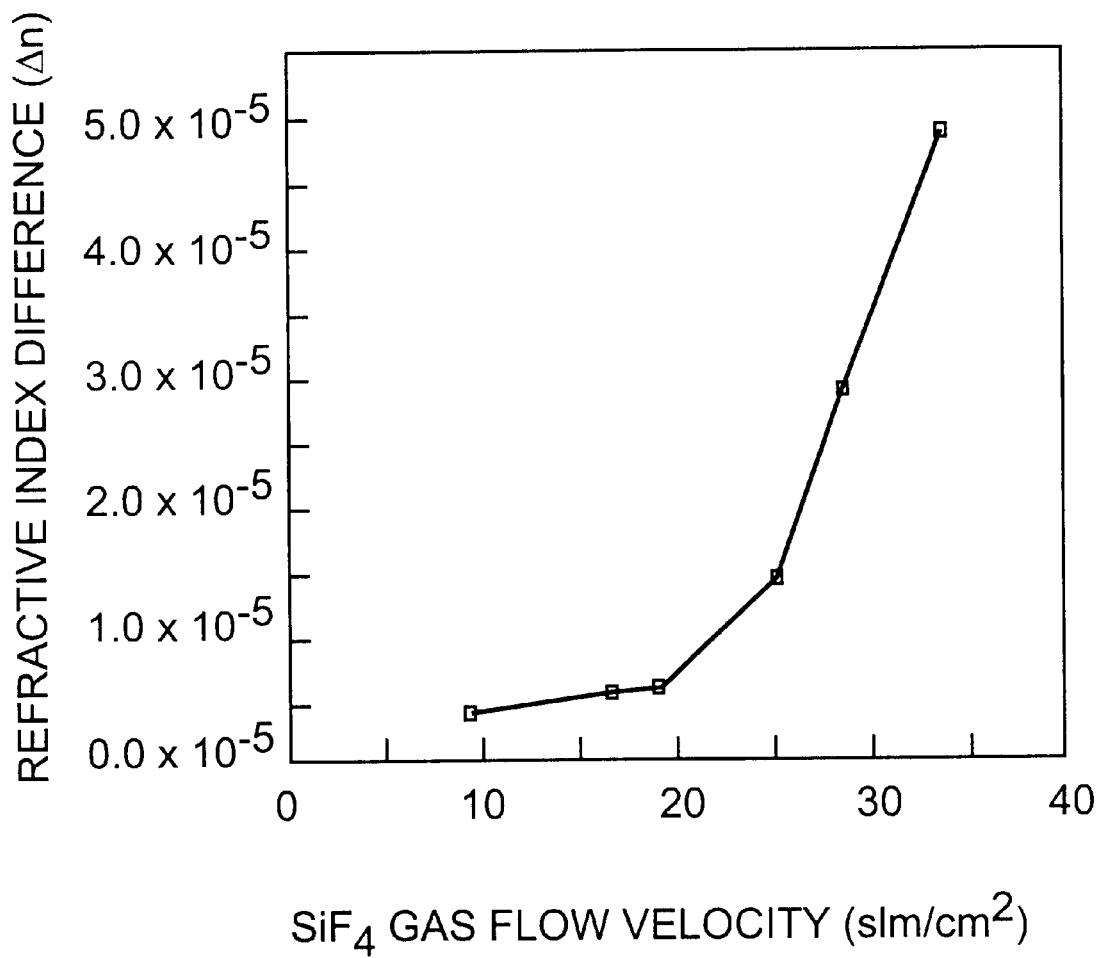
FIG. 2 is a graph showing the correlation between the flow velocity at which a silicon tetrafluoride ($SiF_4$) gas is expelled and the refractive index difference ($\Delta n$) of the resultant silica glasses.

FIG. 2 shows data for the refractive index differences ($\Delta n$) measured for second and third embodiments and second to fourth comparative examples, which will be described below. As shown in FIG. 2, there is a correlation between the speed at which silicon tetrafluoride (SiF$_4$) gas is expelled and the refractive index difference ($\Delta n$) in the resultant silica glasses. The X axis represents the material flow speed (flow velocity) (slm/cm$^2$) of silicon tetrafluoride gas, and the Y axis represents the refractive index difference ($\Delta n$).

As shown in FIG. 2, the greater flow velocity of silicon tetrafluoride gas is, the greater refractive index difference ($\Delta n$) becomes. When the flow velocity is within the range of about 9 to about 22 slm/cm$^2$, the difference in the refractive index ($\Delta n$) between the maximum and the minimum in the silica glass becomes about $1.0 \times 10^{-5}$ or less. As described above, when the refractive index difference ($\Delta n$) has a value of $1.0 \times 10^{-5}$ or less, it is possible to achieve a uniform refractive index profile that is acceptable for use in optical parts of the optical system for excimer laser lithography apparatus.

(2) Measurement of Fluorine (F) Density

A test piece for the fluorine (F) density measurement was cut out in a rectangular block shape (length 20 mm×width 20 mm×thickness 10 mm) from the center portion of the silica glass ingot. Then, after the test piece for the fluorine (F) density measurement was fused with sodium carbonate and made into a specific amount, a quantitative analysis of the fluorine density in the silica glass was conducted using ion-chromatography analysis.

The results also are shown in Table 1. As shown in Table 1, the fluorine density in the silica glass ingot of the first embodiment is less than 200 ppm. Thus, the silica glass has a lower fluorine density value than those in the comparative examples and the density is within the preferable range for the fluorine density (about 100 to about 450 ppm).

Accordingly, the manufacturing method of the first embodiment provides a consistent fluorine density while maintaining the uniformity in the refractive index of the silica glass ingot, thereby improving the durability against ultraviolet light of the silica glass.

(3) Measurement of the Hydroxy Group (OH) Density

A test piece for the hydroxy group (OH) density measurement was cut out in the shape of a rectangular block (length 20 mm×width 20 mm×thickness 10 mm) from a center portion of the silica glass ingot. Then, after optical polishing was applied to both sides of the test piece the density of the hydroxy groups was measured using an infrared absorption spectroscopy by measuring the amount of infrared light absorbed by the OH groups at a wavelength of 1.38 $\mu$m.

The results are shown in Table 1. As shown in Table 1, the density of the hydroxy group in the silica glass ingot of the first embodiment was 980 ppm. This value is within the preferable range of the hydroxy group density (about 600 to about 1300 ppm). Accordingly, the manufacturing method of the first embodiment provides a desirable density of the hydroxy groups, which improves the durability against ultraviolet light of the silica glass.

(4) Measurement of the Density of Metal Elements

A test piece for the metal element measurement was cut out in a rectangular block shape (length 20 mm×width 20 mm×thickness 10 mm) from a center portion of the silica glass. Then the density of each of the metal elements (Mg, Ca, Sc, Ti, V, Cr, Mn, Fe, Co, Ni, Cu, Zn, and Al) was measured using an inductive coupling plasma.

The results are shown in Table 2. As shown in Table 2, the density of each metal element in the silica glass ingot of the first embodiment had an extremely low value of 20 ppb or less. Therefore, it was confirmed that with the manufacturing method of the first embodiment, it is possible to greatly reduce the density of each metal element (Mg, Ca, Se, Ti, V, Cr, Mn, Fe, Co, Ni, Cu, Zn, and Al) in the silica glass that is considered to have adverse effects on the durability against laser beam irradiation. Thus, with the manufacturing method of the first embodiment, the density of each metal element is reduced, and the durability against excimer laser beams is improved.

(5) Measurements of Chlorine, Na and K Densities

A test piece for the chlorine, Na and K density measurements was cut out in a rectangular block shape (length 20 mm×width 20 mm×thickness 10 mm) from a center portion of the silica glass input. Then, the chlorine, Na, and K densities of the test piece were measured using radioactivation analysis by thermal neutron irradiation.

The results are shown in Table 2. As shown in Table 2, the chlorine (Cl) density of the silica glass ingot was below the detection limit ($\leq$0.1 ppm), the Na density was below the detection limit ($\leq$1 ppb), and the K density also was below the detection limit ($\leq$50 ppb). Therefore, it was confirmed that with the manufacturing method of the first embodiment, it is possible to greatly reduce the chlorine, Na and K densities in the silica glass, which are considered to have adverse effects on the refractive index of the silica glass. Therefore, by using the manufacturing method of the first embodiment, the durability against excimer laser irradiation can be improved as a result of reducing the chlorine, Na and K densities.

(6) Measurement of the Durability Against Ultraviolet Light

A test piece for the ultraviolet light resistance (ArF excimer laser) property measurement was cut out in a circular column shape (diameter 60 mm, thickness 10 mm) from the center portion of the silica glass ingot. Then, precision polishing was applied to the test piece using an abrasive on the two opposiing surfaces (circlular shape) of the test piece so that the test piece had a parallelness of 10 seconds or less, a flatness of 3 or less newton rings, and a surface roughness of rms=10 Å. The final thickness of the test piece was 10±0.1 mm. In order to remove any residual abrasive, a finishing process was applied to the test piece with high purity $SiO_2$ powders.

First, the bulk transmittance of the resulting test piece for the ultraviolet light durability measurement was measured using a spectrophotometer before irradiation with an ArF excimer laser beam. The results are shown in Table 1. As shown in Table 1, the bulk absorption coefficient at a wavelength of 193 nm is 0.001 $cm^{-1}$ or less. This value corresponds to a bulk transmittance of 99.9% per unit centimeter, which is an excellent value. The bulk absorption coefficient was calculated based on the following equation (2).

$$\text{Bulk absorption coefficient} = -\frac{\ln(\text{Transmittance}/\text{Theoretical transmittance})}{\text{Thickness of the test piece}} \quad (2)$$

Here, the theoretical transmittance is a transmittance determined by the reflection loss at the surface of the test piece and the internal scattering loss, assuming that the internal absorption loss of the transmitting beam equals to 0.

Next, in order to precisely measure the durability against ultraviolet light of the silica glass, a dehydrogenation process was applied to each of the seven test pieces. Each test piece was placed in a heat treating furnace made of an anhydrous (free of OH group) silica glass tube having an inner diameter of 110 mm and a length of 1000 mm. The pressure in the heat treating furnace was reduced to $10^{-5}$ torr using a diffusion pump and then dissolved hydrogen was removed by maintaining each test piece in the heat treating furnace at a temperature of 700° C. for 60 hours (vacuum anneal). Then, the beat treating furnace and each of the test pieces (seven pieces) were cooled to room temperature to complete the dehydrogenation processing of the test pieces (seven pieces).

The measurement of the dissolved hydrogen density was conducted using a laser Raman spectrophotometer. For all of the test pieces (seven pieces), the density of the dissolved hydrogen was below the detection limit ($1\times10^{16}$ molecules/$cm^3$). Thus, it was confirmed that all of the seven test pieces were fully dehydrogenized.

For all test pieces, the Raman beam intensity at a wavelength of 606 $cm^{-1}$ was not changed by the dehydrogenation process. Therefore, it is considered that only the dissolved hydrogen was removed from the silica glass by the dehydrogenation process, and that the structure of the silica glass itself did not change.

The saturated transmittance and bulk absorption coefficient (the transmittance and the bulk absorption coefficient after changes in these quantities due to irradiation of the silica glass with many ArF excimer laser pulses are saturated) were measured for each of the test pieces that went through the dehydrogenation process. An ArF excimer laser beam used had unit pulse energy density of 200 mJ/cm$^2$/pulse, a repetitive pulse frequency of 100 Hz, and the number of pulses of about 3×10$^5$ to about 5×10$^6$.

The result are shown in Table 1, the transmittance at the saturation point with a wavelength of 193 nm was 81.0%/cm, and the bulk absorption coefficient was 0.115 cm$^{-1}$. From this result, it was confirmed that the silica glass of the first preferred embodiment has a superior transmittance for ultraviolet light even after subjected to severe conditions (the above dehydrogenation process.)

When the ArF excimer laser beam irradiated the silica glass that did not go through the above dehydrogenation process (the silica glass contains some dissolved hydrogen) for unit pulse energy density of 200 mJ/cm$^2$/pulse, a repetitive pulse frequency of 100 Hz and the number of pulses of about 1×10$^6$, the bulk transmittance at a wavelength of 193 nm was 99.0%/cm and the bulk absorption coefficient was 0.01 cm$^{-1}$.

Therefore, it was confirmed that the silica glass of the present embodiment has a superior durability aginst ultraviolet irradiation.

TABLE 2-continued

| | First Embodiment | Second Embodiment | Third Embodiment |
|---|---|---|---|
| Ca density (ppb) | 20 or less | 20 or less | 20 or less |
| Sc density (ppb) | 20 or less | 20 or less | 20 or less |
| Ti density (ppb) | 20 or less | 20 or less | 20 or less |
| V density (ppb) | 20 or less | 20 or less | 20 or less |
| Cr density (ppb) | 20 or less | 20 or less | 20 or less |
| Mn density (ppb) | 20 or less | 20 or less | 20 or less |
| Fe density (ppb) | 20 or less | 20 or less | 20 or less |
| Co density (ppb) | 20 or less | 20 or less | 20 or less |
| Ni density (ppb) | 20 or less | 20 or less | 20 or less |
| Cu density (ppb) | 20 or less | 20 or less | 20 or less |
| Zn density (ppb) | 20 or less | 20 or less | 20 or less |
| Al density (ppb) | 20 or less | 20 or less | 20 or less |

Second Preferred Embodiment

Manufacture of Silica Glass

In the embodiment 2, the flow amount of silicon tetrafluoride (SF$_4$) gas was increased from 1.50 slm of the first embodiment to 2.64 slm. Along with this, the speed at which silicon A tetrafluoride gas was expelled was increased from 9.4 slm/cm$^2$ to 16.6 slm/cm$^2$. These were the only changes in the conditions under which the silica glass was manufactured (synthesized).

Property Evaluation of the Silica Glass

In the second preferred embodiment, under the same conditions as the first preferred embodiment, (1) measurement of the refractive index, (2) measurement of the fluorine (F) density, (3) measurement of the hydroxy group (OH) density, (4) measurement of the density of the metal elements, (5) measurement of the density of chlorine, Na and K, and (6) measurement of the durablity against ultraviolet light were conducted.

The results are shown in Tables 1 and 2. As shown in Table 1, the value of Δn, which indicates the uniformity of the refractive index of the silica glass ingot of the second preferred embodiment was 5.3×10$^{-6}$. Thus, it was possible

TABLE 1

| | First Embodiment | Second Embodiment | Third Embodiment | Comparative Example 1 | Comparative Example 2 | Comparative Example 3 | Comparative Example 4 |
|---|---|---|---|---|---|---|---|
| Flow (slm) | 1.50 | 2.64 | 3.00 | 1.32 | 3.95 | 4.50 | 5.27 |
| Flow velocity (slm/cm$^2$) | 9.4 | 16.6 | 18.9 | 8.3 | 24.8 | 28.3 | 33.1 |
| Lowering speed (mm/hr) | 1.00 | 1.97 | 2.20 | — | 2.40 | 3.00 | 3.93 |
| Ingot diameter | 180 | 180 | 200 | — | 240 | 220 | 210 |
| Difference in refractive index Δn | 4.3 × 10$^{-6}$ | 5.3 × 10$^{-6}$ | 5.8 × 10$^{-6}$ | — | 1.5 × 10$^{-5}$ | 3.0 × 10$^{-5}$ | 5.0 × 10$^{-5}$ |
| F density (ppm) | 150 | 160 | 190 | — | 500 | 750 | 1150 |
| OH density (ppm) | 980 | 1180 | 1020 | — | 900 | 1130 | 1000 |
| Initial bulk absorption coefficient (cm$^{-1}$) | 0.001 or less | 0.001 or less | 0.001 or less | — | 0.001 or less | 0.001 or less | 0.001 or less |
| Initial bulk transmittance (%/cm) | 99.9 or greater | 99.9 or greater | 99.9 or greater | — | 99.9 or greater | 99.9 or greater | 99.9 or greater |
| Saturated bulk absorption coefficient (cm$^{-1}$) | 0.115 | 0.121 | 0.117 | — | 0.113 | 0.116 | 0.111 |
| saturated transmittance (%/cm) | 81.0 | 80.6 | 80.8 | — | 81.2 | 80.9 | 81.3 |

—: not measurable

TABLE 2

| | First Embodiment | Second Embodiment | Third Embodiment |
|---|---|---|---|
| Cl density (ppm) | 0.1 or less | 0.1 or less | 0.1 or less |
| Na density (ppb) | 1.0 or less | 1.0 or less | 1.0 or less |
| K density (ppb) | 50 or less | 50 or less | 50 or less |
| Mg density (ppb) | 20 or less | 20 or less | 20 or less | to achieve the characteristics ($1.0 \times 10^{-5}$) for the refractive index difference at a quality level that is acceptable for the optical parts of an optical system for excimer laser lithography apparatus. In other words, it was confirmed that in accordance with the manufacturing method of the second preferred embodiment, it is possible to manufacture a silica glass with a superior uniformity in the refractive index.

Also, as shown in Table 1, the fluorine density of the silica glass of the second preferred embodiment was 160 ppm. It was confirmed that the fluorine density was slightly greater than that of the silica glass of the first preferred embodiment. Therefore, it is considered that with the manufacturing method of the second preferred embodiment, the fluorine (F) density in the desirable range can be easily obtained, and the durability against ultraviolet light of the silica glass is improved while maintaining the uniformity in the refractive index of the silica glass.

In addition, as shown in Table 1, the density of the hydroxy groups in the silica glass ingot of the second preferred embodiment was 1180 ppm.

Moreover, the densities of the metal elements (Mg, Ca, Sc, Ti, V, Cr, MA, Fe, Co, Ni, Cu, Zn, Al) each were an extremely low value of below 20 ppb, as shown in Table 2.

Therefore, with the manufacturing method of the second preferred embodiment, it is considered that the superior uniformity in the refractive index of the silica glass was further achieved by lowering the density of each metal element.

As shown in Table 2, the chlorine (Cl) density in the silica glass of the second preferred embodiment was below the detection limit (0.1 ppm). The Na density was below the detection limit (1 ppb) and the K density was below the detection limit (50 ppb) as well.

As shown in Table 1, an excellent value of 0.001 cm$^{-1}$ or less was obtained for the bulk absorption coefficient before irradiation by an ArF excimer laser beam (initial bulk absorption coefficient) and the bulk transmittance (initial bulk transmittance) was 99.9%/cm or greater for the silica glass ingot of the second preferred embodiment.

The saturated bulk absorption coefficient after irradiation by an ArF excimer laser beam (bulk absorption coefficient at the saturation point) of the silica glass of the second preferred embodiment, to which the dehydrogenation process was applied as in the first preferred embodiment, was 0.121 cm$^{-1}$ and the saturated bulk transmittance (transmittance at saturation point) was 80.6%/cm. Therefore, it was confirmed that even after subjected to severe conditions (the above-mentioned dehydrogenation process), the silica glass of the second preferred embodiment has a superior transmittance for ultraviolet light, which indicates a superior durability against ultraviolet light.

Third Preferred Embodiment

Manufacture of Silica Glass

In the third preferred embodiment, the silicon tetrafluoride (SiF$_4$) gas flow amount was increased from 1.50 slm for the first preferred embodiment to 3.00 slm. Along with this, the speed at which silicon tetrafluoride gas was expelled was increased from 9.4 slm/cm$^2$ to 18.9 slm/cm$^2$. With the exception of the ingot diameter of the silica glass being changed from 180 mm of the first preferred embodiment to 200 mm, this was the only change in the conditions under which the silica glass was manufactured (synthesized).

Property Evaluation of the Silica Glass

For the third preferred embodiment, under the same conditions as the first preferred embodiment, (1) measurement of the refractive index, (2) measurement of the fluorine (F) density, (3) measurement of the hydroxy group (OH) density, (4) measurement of the density of the metal elements, (5) measurement of the density of chlorine, Na, and K, and (6) measurement of the durability against ultraviolet light were also conducted.

The results are shown in Tables 1 and 2. As shown in Table 1, the value of Δn, which indicates the uniformity in the refractive index of the silica glass ingot of the third preferred embodiment was $5.8 \times 10^{-6}$. Thus, it was possible to achieve a quality level for the refractive index difference that is acceptable for the optical parts of an optical system for excimer laser lithography apparatus. Therefore, it was confirmed that in accordance with the manufacturing method of the third preferred embodiment, it is possible to manufacture a silica glass with a superior uniformity in the refractive index.

As shown in Table 1, it was confirmed that the fluorine density of the silica glass of the third preferred embodiment was 190 ppm. Therefore, in accordance with the manufacturing method of the third preferred embodiment, a fluorine density within a specific range can easily be obtained. With the results of the refractive index, it becomes possible to improve the durability against ultraviolet light while maintaining the uniformity in the refractive index of the silica glass.

As shown in Table 1, the hydroxy group density of the silica glass of the third preferred embodiment was 1020 ppm. Therefore, in accordance with the manufacturing method of the third preferred embodiment, it is possible to obtaine the hydroxy group density within the desirable range.

Furthermore, as shown in Table 2, the density of each of the metal elements (Mg, Ca, Sc, Ti, V, Cr, Mn, Fe, Co, Ni, Cu, Zn, and Al) in the silica glass of the third preferred embodiment was the extremely low value of 20 ppb or less.

Moreover, as shown in Table 2, the chlorine (Cl) density in the silica glass of the third preferred embodiment was below the detection limit (0.1 ppm). The Na density was below the detection limit (1 ppb) and the K density also was below the detection limit (50 ppb).

As shown in Table 1, the excellent value of 0.001 cm$^{-1}$ or less was obtained for the bulk absorption coefficient (initial bulk absorption coefficient) and the bulk transmittance (initial bulk transmittance) was 99.90%/cm or greater before irradiation of the silica glass ingot of the third preferred embodiment by an ArF excimer laser beam.

The saturated bulk absorption coefficient after irradiation by an ArF excimer laser beam (bulk absorption coefficient at saturation point) of the silica glass of the third preferred embodiment, to which the dehydrogenation process was applied as in the the first preferred embodiment, was 0.117 cm$^{-1}$, and the bulk transmittance was 80.8%/cm. Therefore, it was confirmed that even after being subjected to severe conditions (the above-mentioned dehydrogenation process), the silica glass of the third preferred embodiment had a superior durability against ultraviolet light irradiation.

COMPARATIVE EXAMPLE 1

In the comparative example 1, the flow amount for silicon tetrafluoride (SiF$_4$) gas was decreased from 1.50 slm for the first preferred embodiment to 1.32 slm. Along with this, the speed at which silicon tetrafluoride gas was expelled was decreased from 9.4 slm/cm$^2$ to 8.3 slm/cm$^2$. This was the only change under which the silica glass was manufactured (synthesized).

However, under the manufacturing conditions of the comparative example 1, it was impossible to grow silica glass on the target and to take it out as an ingot. Therefore, eavluation of properties of the silica glass, such as measurement of the refractive index, could not be conducted.

COMPARATIVE EXAMPLE 2

Manufacture of Silica Glass

In the comparative example 2, the flow amount of silicon tetrafluoride ($SiF_4$) gas was increased from 1.50 slm for the first preferred embodiment to 3.95 slm. Along with this, the speed at which silicon tetrafluoride gas was expelled was increased from 9.4 slm/cm$^2$ to 24.8 slm/cm$^2$. With the exception of the ingot diameter of the silica glass being changed from 180 mm of the first preferred embodiment to 240 mm, this was the only change in the conditions under which the silica glass was manufactured (synthesized).

Property Evaluation of the Silica Glass

For the comparative example 2, under the same conditions as the first preferred embodiment, (1) measurement of the refractive index, (2) measurement of the fluorine (F) density, (3) measurement of the hydroxy group (OH) density, and (6) measurement of the durability against ultraviolet light were also conducted.

The results are shown in Table 1. As shown in Table 1, the value Δn, which indicates the uniformity of the refractive index of the silica glass ingot of the comparative example 2 was $1.5 \times 10^{-5}$. This was an insufficient quality level for the characteristics of the refractive index difference to be acceptable for the optical parts of the optical system for excimer laser lithography apparatus.

In addition, as shown in Table 1, it was found that the fluorine density of the silica glass of the comparative example 2 was 500 ppm. Therefore, with the manufacturing method of the comparative example 2, the fluorine density exceeds the preferable range for the fluorine (F) density (about 100 to about 450 ppm). It is considered that the refractive index of the silica glass becomes non-uniform due to this undesirable flurine density.

Similarly, as shown in Table 1, the hydroxy group (OH) density in the silica glass of the comparative example 2 was 900 ppm. As a density for the hydroxy group this value is slightly low. However, it was found that even with the manufacturing method of the comparative example 2, it is possible to obtain a silica glass with a hydroxy group density within the designated range (about 600 to about 1300 ppm).

The excellent value of 0.001 cm$^{-1}$ or less was obtained for the bulk absorption coefficient (initial bulk absorption coefficient) of the silica glass ingot of the comparative example 2 and the bulk transmittance (initial bulk transmittance) was 99.9%/cm or greater before irradiation by an ArF excimer laser beam.

The saturated bulk absorption coefficient after irradiation by an ArF excimer laser beam (bulk absorption coefficient at a saturation point) of the silica glass of the comparative example 2, to which the dehydrogenation process was applied as in the first preferred embodiment, was 0.113 cm$^{-1}$ and the saturated bulk transmittance was 81.2%/cm. Thus, it was confirmed that the durability against ultraviolet light of the silica glass of the comparative example 2 was comparable to that for the silica glass ingots of the first to third embodiments.

COMPARATIVE EXAMPLE 3

Manufacture of Silica Glass

In the comparative example 3, the flow amount of silicon tetrafluoride ($SiF_4$) gas was increased from 1.50 slm for the first preferred embodiment to 4.50 slm. Along with this, the speed at which silicon tetrafluoride gas was expelled was increased from 9.4 slm/cm$^2$ to 28.3 slm/cm$^2$. With the exception of the ingot diameter of the silica glass being changed from 180 mm of the first preferred embodiment to 220 mm, this was the only change in the conditions under which the the silica glass was manufactured (synthesized).

Property Evaluation of the Silica Glass

For the comparative example 3, under the same conditions as the first preferred embodiment, (1) measurement of the refractive index, (2) measurement of the fluorine (F) density, (3) measurement of the hydroxy group (OH) density, and (6) measurement of the durability against ultraviolet light were also conducted.

The results are shown in Table 1. As shown in Table 1, the value Δn, which indicates the uniformity of the refractive index in the silica glass ingot of the comparative example 3 was $3.0 \times 10^{-5}$. Thus, the silica glass of the comparative example 3 has an insufficient quality level for the characteristics of the refractive index difference for it to be acceptable for the optical system (optical parts) for excimer laser lithography apparatus.

As shown in Table 1, it was found that the fluorine density in the silica glass of the comparative example 3 was 750 ppm. Therefore, in the manufacturing method of the comparative example 3, the fluorine density exceeds the desirable range (about 100 to about 450 ppm), and it is considered that the refractive index of the silica glass becomes non-uniform due to this undesirable flurine density.

As shown in Table 1, the density of the hydroxy group in the silica glass of the comparative example 3 was 1130 ppm. Therefore, it was found that even with the manufacturing method of the comparative example 3, it is possible to obtain a silica glass with a hydroxy group density within the designated range (about 600 to about 1300 ppm.)

The excellent value of 0.001 cm$^{-1}$ or less was obtained for the bulk absorption coefficient (initial bulk absorption coefficient) of the silica glass ingot of the comparative example 3 and the bulk transmittance (initial bulk transmittance) was 99.9%/cm or greater before irradiation by an ArF excimer laser beam. There was no significant difference observed from these values of the first to third preferred embodiments.

The saturated bulk absorption coefficient after irradiation by an ArF excimer laser beam (bulk absorption coefficient at saturation point) of the silica glass of the comparative example 3, to which the dehydrogenation process was applied as in the first preferred embodiment, was 0.116 cm$^{-1}$ and the saturated bulk transmittance (transmittance at the saturation point) was 80.9%/cm. Therefore, it was confirmed that for the durability against ultraviolet light, the silica glass of the comparative example 3 has an comparable value to the silica glass ingot of the first to third embodiments.

COMPARATIVE EXAMPLE 4

Manufacture of Silica Glass

In the comparative example 4, the flow amount of silicon tetrafluoride ($SiF_4$) gas was increased from 1.50 slm for the first preferred embodiment to 5.27 slm. Along with this, the speed at which silicon tetrafluoride gas was expelled was increased from 9.4 slm/cm$^2$ to 33.1 slm/cm$^2$. With the exception of the ingot diameter of the silica glass being changed from 180 mm of the first preferred embodiment to 210 mm, this was the only change in the conditions under which the silica glass was manufactured (synthesized).

Property Evaluation of the Silica Glass

For the comparative example 4, under the same conditions as in the first preferred embodiment, (1) measurement of the refractive index, (2) measurement of the fluorine (F) density, (3) measurement of the hydroxy group (OH) density, and (6) measurement of the durability against ultraviolet light were also conducted.

The results are shown in Table 1. As shown in Table 1, the value A, which indicates the uniformity in the refractive index of the silica glass ingot of the comparative example 4 was $5.0 \times 10^{-5}$. Thus, the silica glass of the comparative example 4 had insufficient quality for the characteristics (uniformity) of the refractive index difference to be acceptable for the optical system (optical parts) of an excimer laser lithography apparatus.

In addition, as shown in Table 1, it was confirmed that the fluorine density of the silica glass of the comparative example 4 was 1150 ppm. Therefore, in the manufacturing method of the comparative example 4, the fluorine density exceeds the preferable range (about 100 to about 450 ppm) and it is considered that the refractive index of the silica glass ingot becomes non-uniform due to this undesirable fluorine density.

As shown in Table 1, the density of the hydroxy group in the silica glass of the comparative example 4 was 1000 ppm. Therefore, it was found that even with the manufacturing method of the comparative example 4, it is possible to obtain a silica glass with a hydroxy group density within the designated range (about 600 to about 1300 ppm.)

The excellent value of 0.001 $cm^{-1}$ or less was obtained for the bulk absorption coefficient (initial bulk absorption coefficient) of the silica glass ingot of the comparative example 4, and the bulk transmittance (initial bulk transmittance) was 99.9%/cm or greater before irradiation by an ArF excimer laser beam. There was no significant difference observed from these values for the first to third preferred embodiments.

The saturated bulk absorption coefficient (bulk absorption coefficient at the saturation point) after irradiation by an ArF excimer laser beam of the silica glass of the comparative example 4, to which the dehydrogenation process was applied as in the first preferred embodiment, was 0.111 $cm^{-1}$ and the saturated bulk transmittance was 81.3%/cm. Therefore, it was confirmed that for the durability against ultraviolet light, the silica glass of the comparative example 4 shows an comparable value to the silica glass ingot of the first to third prefered embodiments.

As described above, according to the present invention, by setting the fluorine density in a substantially chlorine (Cl) free silica glass to within a range of about 100 ppm to about 450 ppm and by limiting the difference between the maximum refractive index and the minimum refractive index of the silica glass to within the range of about $1.0 \times 10^{-7}$ to about $1.0 \times 10^{-5}$, the problem of non-uniform refractive index profile when the silica glass is manufactured using silicon tetrafluoride gas as a material is solved. Thus, it is possible to obtain silica glass appropriate for optical parts that requires a high durability against ultraviolet light, such as optical system (optical parts) for photolithography apparatus using an ultraviolet laser having a wavelengh of 300 nm or less (ArF excimer laser, for example).

A manufacturing method of silica glass that is substantially free of chlorine (Cl) according to the present invention includes the steps of expelling each of silicon tetrafluoride ($SiF_4$), a combustion gas, and a combustible gas separately from a burner made of silica glass, and producing minute silica glass particles by reacting the silicon tetrafluoride gas and water which is a reaction product of the oxygen gas and the hydrogen gas. The manufacturing method further includes the steps of depositing the minute silica glass particles on a target, and producing the silica glass by fusing and vitrificating the minute silica glass particles deposited on the target. Here, the flow velocity of the silicon tetrafluoride gas is preferably within the range of about 9 to about 20 slm/$cm^2$ to easily control the fluorine density of the silica glass to be within the range of about 100 to about 450 ppm and to easily control the difference between the maximum refractive index and the minimum refractive index of the silica glass ($\Delta n$) to be within the range of about $1.0 \times 10^{-7}$ to about $1.0 \times 10^{-5}$. Accordingly, the present invention solves the problem that when the silicon tetrafluoride gas is used as a material for the synthesis of silica gas, the refractive index tends to be non-uniform. Thus, according to the present invention, it becomes possible to easily and consistently obtain a silica glass that is appropriate for optical parts that require a high durability against ultraviolet light, such as the optical parts of an optical imaging system for photolithography apparatus which uses an ultraviolet laser of 300 nm or less (ArF excimer laser, for example) as a light source.

It will be apparent to those skilled in the art that various modifications and variations can be made in the silica glass and its manufacturing method of the present invention without departing from the spirit or scope of the invention. Thus, it is intended that the present invention cover the modifications and variations of this invention provided they come within the scope of the appended claims and their equivalents.

What is claimed is:

1. A silica glass member that is substantially free of chlorine (Cl), and includes a fluorine (F) concentration of about 100 ppm to about 450 ppm, wherein the silica glass member has a region having dimensions of about 150 mm in diameter and about 50 mm in thickness, and a difference between the maximum refractive index and the minimum refractive index in the region ($\Delta n$) is within the range of about $1.0 \times 10^{-7}$ to about $1.0 \times 10^{-5}$.

2. The silica glass member according to claim 1, wherein the concentration of each of metal elements, Mg, Ca, Sc, Ti, V, Cr, Mn, Fe, Co, Ni, Cu, Zn, and Al, in the silica glass member is about 20 ppb or less.

3. The silica glass member according to claim 1, wherein the concentration of hydroxy (OH) groups in the silica glass member is within the range of about 600 ppm to about 1300 ppm.

4. The silica glass member according to claim 3, wherein the concentration of each of metal elements, Mg, Ca, Sc, Ti, V, Cr, Mn, Fe, Co, Ni, Cu, Zn, and Al, in the silica glass member is about 20 ppb or less.

5. A silica glass member having a chlorine concentration of about 0.1 ppm or less and a fluorine concentration of about 100 ppm to about 450 ppm, wherein the silica glass member has a region having dimensions of about 150 mm in diameter and about 50 mm in thickness, and has a substantially uniform refractive index distribution with respect to ultraviolet light such that a difference between the maximum refractive index and the minimum refractive index in the region is within the range of about $1.0 \times 10^{-7}$ to about $1.0 \times 10^{-5}$.

6. The silica glass member according to claim 5, wherein the concentration of each of metal elements, Mg, Ca, Sc, Ti, V, Cr, Mn, Fe, Co, Ni, Cu, Zn, and Al, in the silica glass member is about 20 ppb or less.

7. The silica glass member according to claim 5, wherein the concentration of hydroxy groups in the silica glass member is within the range of about 600 ppm to about 1300 ppm.

8. The silica glass member according to claim 7, wherein the concentration of hydroxy groups in the silica glass member is within the range of about 900 ppm to about 1200 ppm.

9. The silica glass member according to claim 7, wherein the concentration of each of metal elements, Mg, Ca, Sc, Ti, V, Cr, Mn, Fe, Co, Ni, Cu, Zn, and Al, in the silica glass member is about 20 ppb or less.

10. The silica glass member according to claim 5, wherein the fluorine concentration is within the range of about 120 ppm to about 300 ppm.

11. The silica glass member according to claim 10, wherein the fluorine concentration is within the range of about 140 ppm to about 200 ppm.

12. The silica glass member according to claim 5, wherein the difference between the maximum refractive index and the minimum refractive index in the region is within the range of about $5.0 \times 10^{-7}$ to about $6.0 \times 10^{-6}$.

13. A silica glass ingot to be cut out to produce a silica glass member of processing ultraviolet light, wherein the silica glass ingot has a region having dimensions of about 150 mm in diameter and has a chlorine concentration of about 0.1 ppm or less and a fluorine concentration of about 100 ppm to about 450 ppm, the silica glass ingot having a substantially uniform refractive index distribution with respect to ultraviolet light such that a difference between the maximum refractive index and the minimum refractive index in the region is within the range of about $1.0 \times 10^{-7}$ to about $1.0 \times 10^{-5}$.

14. A silica glass member having a chlorine concentration of about 1.0 ppm or less and a fluorine concentration of about 100 ppm to about 450 ppm, the silica glass member having a substantially uniform refractive index distribution with respect to ultraviolet light such that a difference between the maximum refractive index and the minimum refractive index is within the range of about $1.0 \times 10^{-7}$ to about $1.0 \times 10^{-5}$ over dimensions of about 150 mm in diameter and about 50 mm in thickness.

15. A silica glass member that is substantially free of chlorine (Cl), and includes a fluorine (F) concentration of about 100 ppm to about 450 ppm, wherein the silica glass member has a region having dimensions of about 150 mm in diameter, and a difference between the maximum refractive index and the minimum refractive index in the region ($\Delta$n) is within the range of about $1.0 \times 10^{-7}$ to about $1.0 \times 10^{-5}$.

16. A silica glass lens that is substantially free of chlorine (Cl), and includes a fluorine (F) concentration of about 100 ppm to about 450 ppm, wherein a difference between the maximum refractive index and the minimum refractive index in the silica glass lens ($\Delta$n) over dimensions of about 150 mm in diameter and about 50 mm in thickness is within the range of about $1.0 \times 10^{-7}$ to about $1.0 \times 10^{-5}$.

17. A silica glass lens having a chlorine concentration of about 0.1 ppm or less and a fluorine concentration of about 100 ppm to about 450 ppm, wherein the silica glass lens has a substantially uniform refractive index distribution with respect to ultraviolet light such that a difference between the maximum refractive index and the minimum refractive index in the silica glass lens over dimensions of about 150 mm in diameter and about 50 mm in thickness is within the range of about $1.0 \times 10^{-7}$ to about $1.0 \times 10^{-5}$.

18. A silica glass lens that is substantially free of chlorine (Cl), and includes a fluorine (F) concentration of about 100 ppm to about 450 ppm, wherein a difference between the maximum refractive index and the minimum refractive index in the silica glass lens ($\Delta$N) is within the range of $1.0 \times 10^{-7}$ to about $1.0 \times 10^{-5}$ over the dimension of about 150 mm in diameter.

* * * * *